(12) United States Patent
Wang et al.

(10) Patent No.: US 8,363,400 B2
(45) Date of Patent: Jan. 29, 2013

(54) CIRCUIT MODULE AND ELECTRONIC DEVICE USING THE SAME

(75) Inventors: Feng-Ku Wang, Taipei (TW); Chih-Kai Yang, Taipei (TW)

(73) Assignee: Inventec Corporation (TW)

( * ) Notice: Subject to any disclaimer, the term of this patent is extended or adjusted under 35 U.S.C. 154(b) by 212 days.

(21) Appl. No.: 12/982,268

(22) Filed: Dec. 30, 2010

(65) Prior Publication Data

US 2012/0134112 A1     May 31, 2012

(30) Foreign Application Priority Data

Nov. 26, 2010    (CN) ............... 2010 1 0570525

(51) Int. Cl.
*H05K 7/20*      (2006.01)

(52) U.S. Cl. .............. 361/695; 361/679.46; 361/679.47; 361/679.48; 361/697; 361/719; 361/720; 165/121; 165/122; 165/126; 165/80.3; 165/104.33; 165/185; 454/184; 415/176; 415/177; 415/178; 415/213.1; 415/214.1; 417/360; 417/423.1; 417/423.14; 417/423.15; 29/832; 29/837; 29/838; 29/890.03; 29/890.035; 29/890.45

(58) Field of Classification Search ............ 361/679.46–679.54, 688–697, 361/715–724; 165/80.2–80.5, 104.33, 104.34, 165/121–126, 185; 174/15.1, 16.3, 252; 257/706–727; 454/184; 29/832–838, 890.03, 29/890.033, 890.035, 890.045; 415/176, 415/177, 178, 213.1, 214.1; 417/423.1, 423.14, 417/423.15

See application file for complete search history.

(56) References Cited

U.S. PATENT DOCUMENTS

| | | | | |
|---|---|---|---|---|
| 6,315,031 | B1 * | 11/2001 | Miyahara et al. ............ | 165/80.3 |
| 6,442,025 | B2 * | 8/2002 | Nakamura et al. ........... | 361/695 |
| 6,587,342 | B1 | 7/2003 | Hsu | |
| 6,817,939 | B2 * | 11/2004 | Gan et al. ..................... | 454/184 |
| 7,333,340 | B2 * | 2/2008 | Zhang et al. .................. | 361/719 |
| 7,339,787 | B2 * | 3/2008 | Cheng et al. .................. | 361/695 |
| 7,352,574 | B2 * | 4/2008 | Chen ............................ | 361/695 |
| 7,390,172 | B2 * | 6/2008 | Winkler .................. | 417/423.15 |
| 7,489,510 | B1 * | 2/2009 | Hung et al. ................... | 361/700 |
| 7,697,288 | B2 * | 4/2010 | Okutsu ........................ | 361/695 |
| 7,990,713 | B2 * | 8/2011 | Liu et al. ..................... | 361/700 |
| 2008/0130240 | A1 * | 6/2008 | Wang et al. .................. | 361/719 |

FOREIGN PATENT DOCUMENTS

| | | |
|---|---|---|
| TW | M310367 | 4/2007 |
| TW | I299116 | 7/2008 |

* cited by examiner

*Primary Examiner* — Michail V Datskovskiy

(74) *Attorney, Agent, or Firm* — Lowe Hauptman Ham & Berner, LLP

(57) ABSTRACT

An electronic device is provided. The electronic device includes a mechanism, a circuit module and a fixing element. The circuit module is disposed inside the mechanism. The circuit module includes a circuit board and a fan. The circuit board has at least one edge and a fixing hole. The fan has a first lateral side and a second lateral side. The first lateral side has a first hook buckled on the edge. The second lateral side has at least one screwed board, wherein the screwed board has a screwed hole. The fixing element is screwed on the screwed hole and the fixing hole to screw the fan on the circuit board.

14 Claims, 3 Drawing Sheets

CIRCUIT MODULE AND ELECTRONIC DEVICE USING THE SAME

This application claims the benefit of People's Republic of China application Serial No. 201010570525.0, filed Nov. 26, 2010, the subject matter of which is incorporated herein by reference.

BACKGROUND OF THE INVENTION

1. Field of the Invention

The invention relates in general to a circuit module and an electronic device using the same, and more particularly to a circuit module with a fan and an electronic device using the same.

2. Description of the Related Art

Electronic products which have reached a mature state are now widely and frequently used by people. Since electronic products are driven by electrical power, it is inevitable that heat will be generated during the use of electronic products. In general, the operating performance of the electronic products operating in a high-temperature environment is inferior to the operating performance of the electronic products operating in a low-temperature environment. Thus, electronic products must dissipate the generated heat to avoid the temperature of the operating environment being too high and resulting in inferior performance. Therefore, the current electronic products, such as computers, are normally equipped with a fan for dissipating the heat to reduce the internal temperature of the electronic products lest the operating performance of the electronic products should deteriorate. Therefore, how to dispose the fan inside the mechanism of the electronic products efficiently and effectively so as to reduce the use of facility and labor has become an imminent task to the industries.

SUMMARY OF THE INVENTION

The invention is directed to a circuit module and an electronic device using the same. A fan is buckled on a circuit board, and is thus disposed inside the mechanism quickly and effectively.

According to a first aspect of the present invention, an electronic device is provided. The electronic device includes a mechanism, a circuit module and a fixing element. The circuit module is disposed inside the mechanism. The circuit module includes a circuit board and a fan. The circuit board has at least one edge and a fixing hole. The fan has a first lateral side and a second lateral side. The first lateral side has a first hook buckled on the edge. The second lateral side has at least one screwed board, wherein the screwed board has a screwed hole. The fixing element is screwed on the screwed hole and the fixing hole to screw the fan on the circuit board.

According to a second aspect of the present invention, a circuit module is provided. The circuit module is disposed inside a mechanism of the electronic device. The circuit module includes a circuit board and a fan. The circuit board has at least one edge and a fixing hole. The fan has a first lateral side and a second lateral side. The first lateral side has a first hook buckled on the edge. The second lateral side has at least one screwed board, wherein the screwed board has a screwed hole. The screwed hole is further screwed on the fixing hole via the fixing element to screw the fan on the circuit board.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
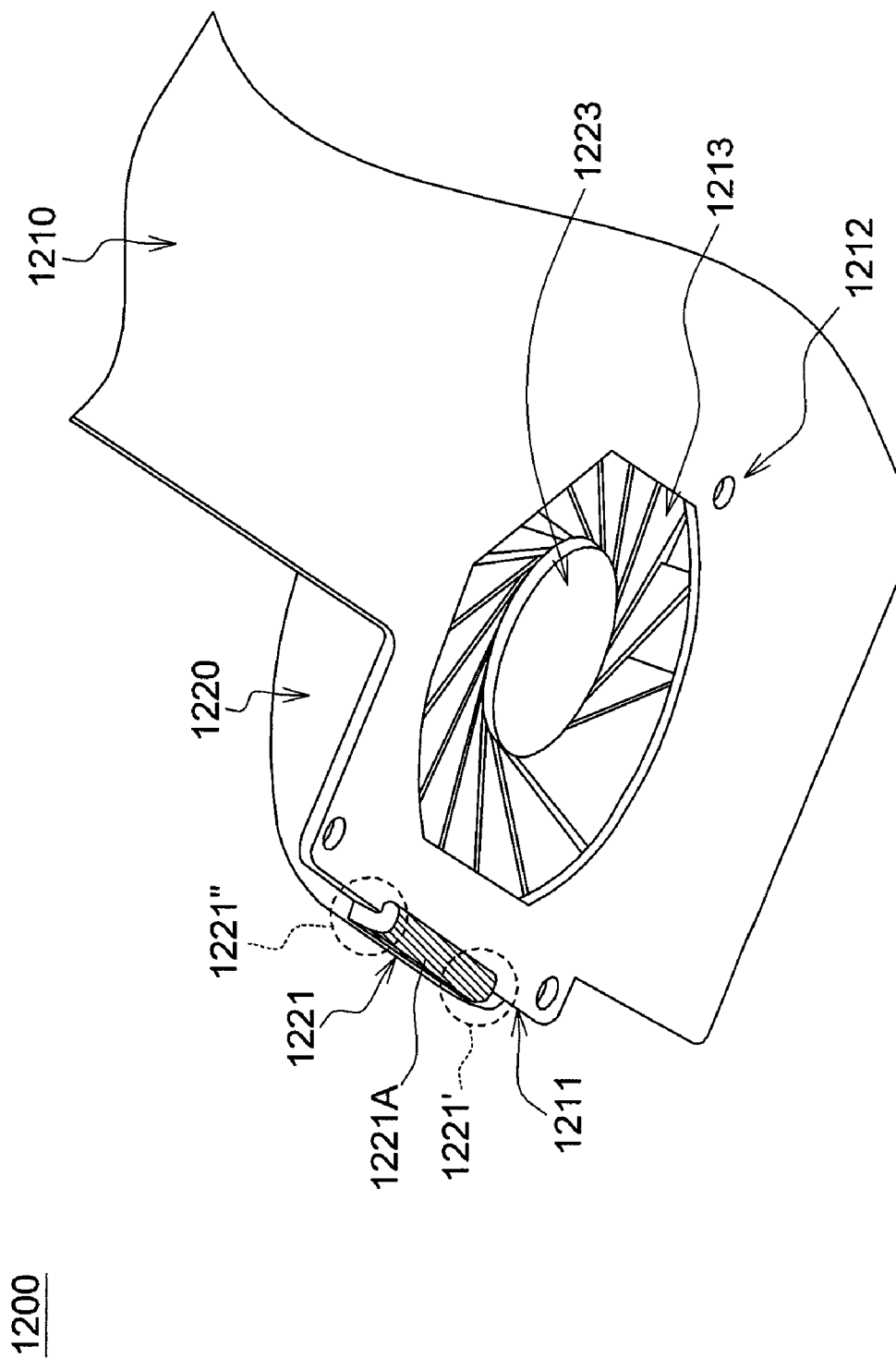
FIG. 1 shows a bottom view of a circuit module of an embodiment of the invention.
Figure 2:
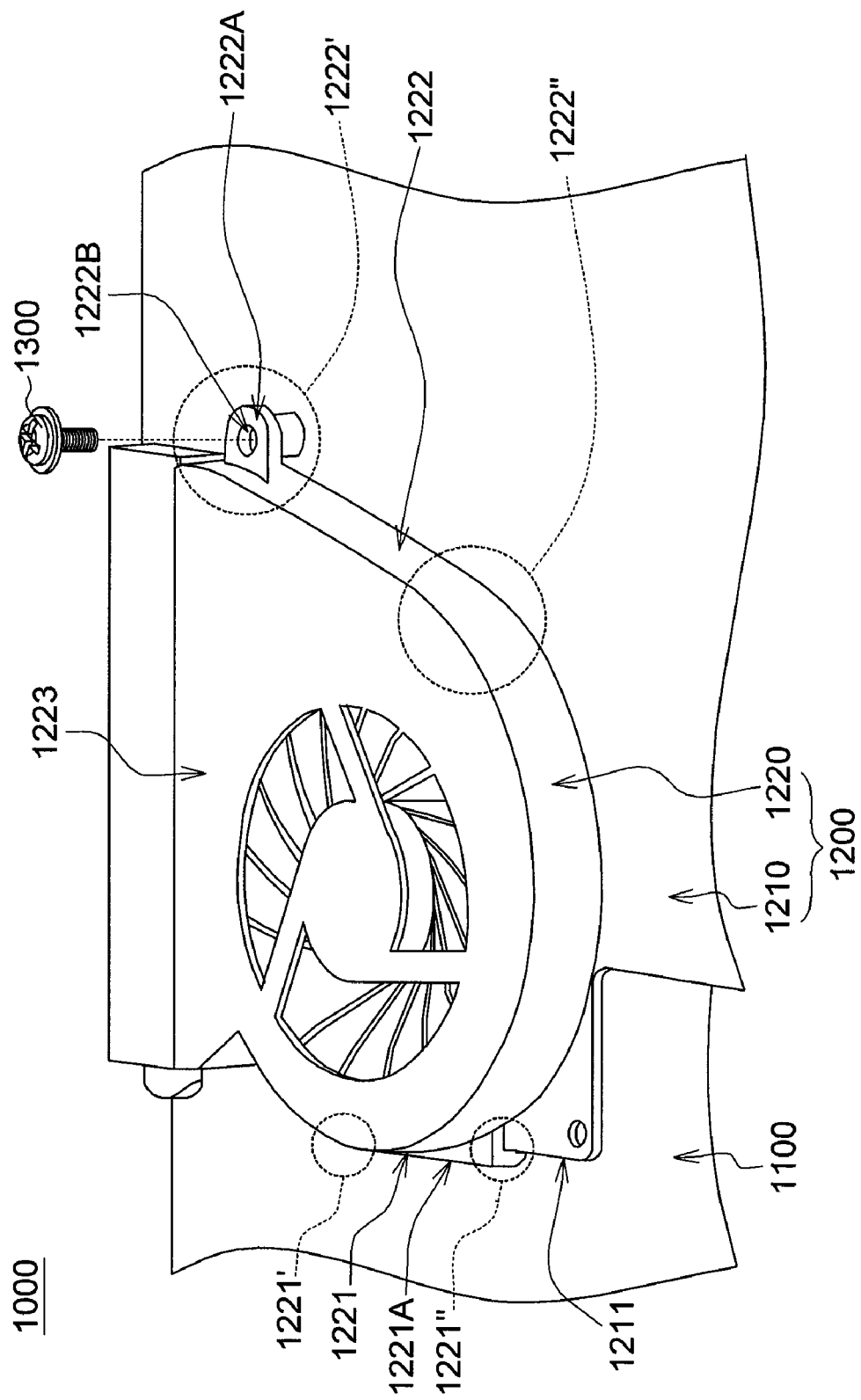
FIG. 2 shows a top view of the electronic device of FIG. 1.

Referring to FIG. 1, a bottom view of a circuit module 1200 of an embodiment of the invention is shown. Referring to FIG. 2, a top view of the electronic device 1000 of FIG. 1 is shown. The electronic device 1000 can be realized by such as a notebook computer or a desktop computer. FIG. 1 only illustrates a portion of the circuit module 1200. The electronic device 1000 includes a mechanism 1100 and a circuit module 1200. The mechanism 1100 can be realized by such as an iron plate for fixing the motherboard in a computer casing or a casing for fixing a circuit board in a notebook computer. The circuit module 1200 is disposed inside the mechanism 1100.

The electronic device 1000 of the present embodiment of the invention is disclosed below. The electronic device 1000 includes a mechanism 1100, a circuit module 1200, and a fixing element 1300. The circuit module 1200 includes a circuit board 1210 and a fan 1220. The circuit board 1210 has at least one edge 1211 and a fixing hole 1212. The fan 1220 is screwed on the circuit board 1210 and has a first lateral side 1221 and a second lateral side 1222. The second lateral side 1222 is substantially opposite to the first lateral side 1221. The first lateral side 1221 has a first hook 1221A buckled on the edge 1211. The second lateral side 1222 has at least one screwed board 1222A having a screwed hole 1222B. The fixing element 1300 is screwed on the screwed hole 1222B and the fixing hole 1212 to screw the fan 1220 on the circuit board 1210. The fixing element 1300 can be realized by such as a screw.

The relative positions between the screwed board 1222A and the first hook 1221A of the present embodiment of the invention are disclosed below. As indicated in FIG. 1 and FIG. 2, the screwed board 1222A is substantially disposed on a segment of the second lateral side 1222. For example, the first lateral side 1221 has a first segment 1221' and a second segment 1221", wherein the second lateral side 1222 has a third segment 1222' and a fourth segment 1222". For the fan 1220 to be fixed on the circuit board 1210, the first hook 1221A is substantially disposed on the first segment 1221' and the second segment 1221" of the first lateral side 1221. That is, the first hook 1221A is a long straight hook, wherein one terminal of the first hook 1221A is disposed on the first segment 1221', and the other terminal of the first hook 1221A is extended towards the second segment 1221" and disposed thereon. The screwed board 1222A is substantially disposed on the third segment 1222' of the second lateral side 1222, wherein the first segment 1221' and the second segment 1221" as a whole are diagonal to the third segment 1222', and the first segment 1221' and the second segment 1221" correspond to the fourth segment 1222".

Since the relative positions between the screwed board 1222A and the first hook 1221A are substantially diagonal to each other, the fan 1220 can be fixed on the circuit board 1210 by the first hook 1221A and the screwed board 1222A alone.

Thus, the fan 1220 only needs one screwed hole 12228 in addition to the first hook 1221A for the fixing element 1300 to fix the fan. That is, in comparison to the conventional method which requires many screws to screw the fan on the circuit board, the practice of fixing the fan 1220 on the circuit board 1210 according to the present embodiment of the invention reduces the quantity of the fixing element 1300. Thus, the circuit module 1200 of the electronic device 1000 of the present embodiment of the invention not only reduces the manufacturing cost, but also reduces the labor and manufacturing time required for screwing the fan 1220 on the circuit board 1210, so as to reduce the product price and enhance product competiveness.

Figure 3:
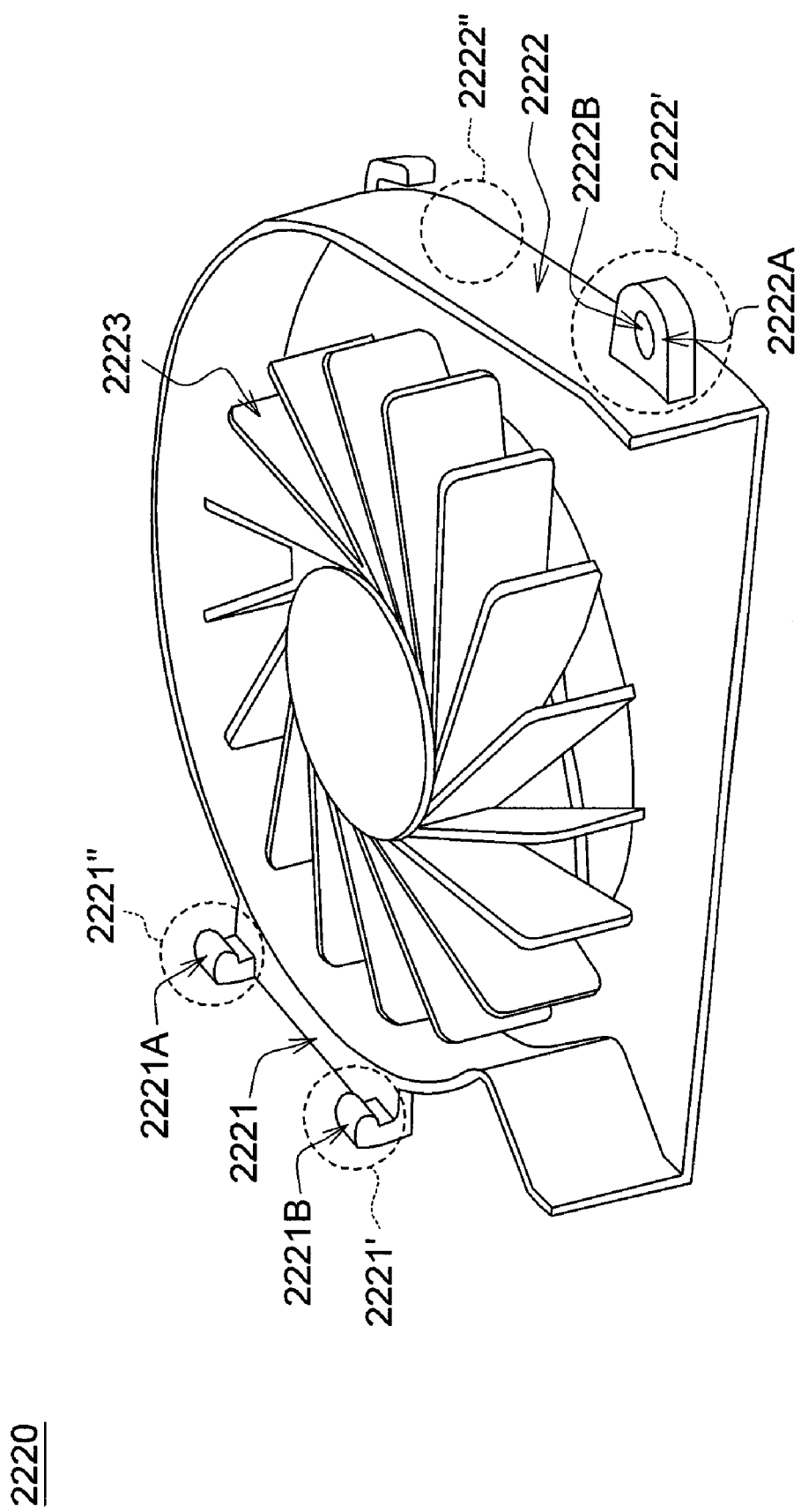
FIG. 3 shows a bottom view of a fan of another embodiment of the invention.

To enhance the fixing effect of fixing the fan 1220 on the circuit board 1210, the elasticity effect of fixing the fan 1220 on the circuit board 1210 can be increased to avoid the first hook 1221A being damaged due to the negligence during assembly. For example, the first lateral side 1221 of the fan 1220 further has a second hook which can be buckled on the edge 1211. Thus, the second hook facilitates the fan 1220 to be fixed on the circuit board 1210. Referring to FIG. 3, a bottom view of a fan 2220 of another embodiment of the invention is shown. The first lateral side 2221, the second lateral side 2222, the first segment 2221', the second segment 2221", the third segment 2222', the fourth segment 2222", the screwed board 2222A, and the screwed hole 2222B of the fan 2220 are similar to the corresponding elements of FIG. 1, and the similarities are not repeated here.

For the fan 2220 of FIG. 3 to be fixed on the circuit board 1210, the first hook 2221A of FIG. 3 is substantially is disposed on the second segment 2221" of the first lateral side 2221, and the second hook 2221B is substantially disposed on the first segment 2221'. That is, the second hook 2221B and the first hook 2221A are symmetrically disposed on two segments of the first lateral side 2221. The screwed board 2222A is substantially disposed on the third segment 2222' of the second lateral side 2222.

Since the first lateral side 2221 of the fan 2220 has the first hook 2221A and the second hook 2221B, the fan 2220 can be more flexibly fixed on the circuit board 1210 to avoid the first hook 2221A and the second hook 2221B being damaged due to the negligence during assembly.

As indicated in FIG. 1 and FIG. 3, the circuit board 1210 further has an inlet opening 1213, and the fan 1220 and 2220 further have fins 1223 and 2223 disposed above the inlet opening 1213 for increasing the ventilation efficiency and enhancing the cooling system.

To summarize, the practice of fixing the fan on the circuit board with a large amount of screws will largely increase labor and manufacturing cost as well. In an embodiment of the circuit module and an electronic device using the same of the invention, the relative positions between the screwed board and the first hook are substantially opposite to each other, so that the fan only needs one screwed hole in addition to the hook for the fixing element to fix the fan. In comparison to the practice of fixing the fan with a large amount of screws, the practice of fixing the fan on the circuit board disclosed in the above embodiment of the invention largely reduces the use of fixing element, not only reducing the manufacturing cost, but also reducing the labor and manufacturing time. Thus, the products manufacturing according to the above embodiments of the invention are more competitive than similar products.

In another embodiment, since the first lateral side of the fan has the first hook and the second hook, the fan can be more flexibly fixed on the circuit board, not only avoiding the hooks being damaged but also increasing the stability of fixing the fan on the circuit board.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a mechanism;
   a circuit module disposed inside the mechanism, wherein the circuit module comprises:
   a circuit board having at least one edge and a fixing hole; and
   a fan having a first lateral side and a second lateral side, wherein the first lateral side has a first hook buckled on the edge, the second lateral side has at least one screwed board having a screwed hole; and
   a fixing element screwed on the screwed hole and the fixing hole to screw the fan on the circuit board.

2. The electronic device according to claim 1, wherein the first lateral side further has a second hook buckled on the edge.

3. The electronic device according to claim 2, wherein the first hook and the second hook are symmetrically disposed on two segments of the first lateral side.

4. The electronic device according to claim 1, wherein the first lateral side of the fan is opposite to the second lateral side of the fan.

5. The electronic device according to claim 4, wherein the first lateral side has a first segment and a second segment, the second lateral side has a third segment and a fourth segment, the screwed board is disposed on the third segment of the second lateral side, the first hook is disposed on the first and the second segments of the first lateral side, the first segment and the second segment as a whole are diagonal to the third segment, and the first segment and the second segment correspond to the fourth segment.

6. The electronic device according to claim 1, wherein the fan has only one screwed hole for screwing the fan on the circuit board.

7. The electronic device according to claim 1, wherein the circuit board further has an inlet opening, the fan further has a fin disposed above the inlet opening.

8. A circuit module disposed inside a mechanism of an electronic device, wherein the circuit module comprises:
   a circuit board having at least one edge and a fixing hole; and
   a fan having a first lateral side and a second lateral side, wherein the first lateral side has a first hook buckled on the edge, and the second lateral side has at least one screwed board having a screwed hole;
   wherein the screwed hole is further screwed on the fixing hole to screw the fan on the circuit board via a fixing element.

9. The circuit module according to claim 8, wherein the first lateral side further has a second hook buckled on the edge.

10. The circuit module according to claim 9, wherein the first hook and the second hook are symmetrically disposed at two terminals of the first lateral side.

11. The circuit module according to claim 8, wherein the first lateral side of the fan is opposite to the second lateral side of the fan.

12. The circuit module according to claim 11, wherein the first lateral side has a first segment and a second segment, the second lateral side has a third segment and a fourth segment, the screwed board is disposed on the third segment of the second lateral side, the first hook is disposed on the first and the second segments of the first lateral side, the first segment and the second segment as a whole are diagonal to the third segment, and the first segment and the second segment correspond to the fourth segment.

13. The circuit module according to claim 8, wherein the fan has only one screwed hole for screwing the fan on the circuit board.

14. The circuit module according to claim 8, wherein the circuit board further has an inlet opening, the fan further has a fin disposed above the inlet opening.

* * * * *